United States Patent
Kim et al.

(10) Patent No.: US 9,711,750 B1
(45) Date of Patent: Jul. 18, 2017

(54) METHOD OF FORMING A CONDUCTIVE PATTERN AND METHOD OF MANUFACTURING AN ORGANIC LIGHT-EMITTING DISPLAY INCLUDING THE SAME

(71) Applicant: SAMSUNG DISPLAY CO., LTD., Yongin-si, Gyeonggi-Do (KR)

(72) Inventors: Taehyun Kim, Yongin-si (KR); Sangho Park, Yongin-si (KR); Seungmin Lee, Yongin-si (KR); Jungkyu Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/214,637

(22) Filed: Jul. 20, 2016

(30) Foreign Application Priority Data

Jan. 27, 2016 (KR) .................. 10-2016-0010172

(51) Int. Cl.
*H01L 51/56* (2006.01)
*H01L 51/52* (2006.01)
*H01L 27/32* (2006.01)
*H01L 51/00* (2006.01)
*H01L 27/12* (2006.01)
*H01L 21/027* (2006.01)
*H01L 21/3205* (2006.01)

(52) U.S. Cl.
CPC ...... *H01L 51/5206* (2013.01); *H01L 27/3246* (2013.01); *H01L 27/3258* (2013.01);
(Continued)

(58) Field of Classification Search
CPC .............. H01L 21/0273; H01L 21/0274; H01L 21/32129; H01L 21/32055;
(Continued)

(56) References Cited

U.S. PATENT DOCUMENTS 6,573,964 B1 * 6/2003 Takizawa .............. G02F 1/1393
349/129
2007/0232080 A1 * 10/2007 Asou ................... H01L 21/0273
438/781

(Continued)

FOREIGN PATENT DOCUMENTS

JP 2007-273827 10/2007
KR 10-2012-0019024 3/2012
KR 10-2014-0141375 12/2014

*Primary Examiner* — Thanh T Nguyen
(74) *Attorney, Agent, or Firm* — F. Chau & Associates, LLC

(57) ABSTRACT

A conductive material layer for forming a conductive pattern is formed on a substrate. A photosensitive organic material layer is formed on the conductive material layer. The photosensitive organic material layer is irradiated through a halftone mask. The halftone mask includes a first mask region having a boundary corresponding to an edge of the conductive pattern, a second mask region, and a third mask region disposed between the first mask region and the second mask region. A first pattern including a first region corresponding to the first mask region and a second region corresponding to the third mask region is formed by removing the photosensitive organic material layer. The conductive material layer is etched using the first pattern as a hard mask to form the conductive pattern having exposed lateral surfaces. A second pattern is formed that covers the lateral surfaces of the conductive pattern by reflowing the first pattern.

20 Claims, 10 Drawing Sheets

(52) U.S. Cl.
CPC ...... *H01L 51/0023* (2013.01); *H01L 51/5253* (2013.01); *H01L 51/56* (2013.01); *H01L 21/0274* (2013.01); *H01L 21/32055* (2013.01); *H01L 27/1248* (2013.01); *H01L 51/5228* (2013.01); *H01L 2227/323* (2013.01)

(58) Field of Classification Search
CPC ........... H01L 21/47635; H01L 51/5253; H01L 51/5228; H01L 51/5206; H01L 51/0023; H01L 51/56; H01L 27/3246; H01L 27/3258; H01L 27/1248; H01L 29/41733; H01L 29/66765; H01L 2227/323

See application file for complete search history.

(56) References Cited

U.S. PATENT DOCUMENTS

| | | | |
|---|---|---|---|
| 2011/0018000 A1* | 1/2011 | Choi | H01L 27/1214 257/72 |
| 2012/0049169 A1 | 3/2012 | Kim | |
| 2014/0034923 A1 | 2/2014 | Kim et al. | |
| 2014/0354286 A1 | 12/2014 | Kim | |
| 2016/0099300 A1 | 4/2016 | Lee et al. | |
| 2016/0190225 A1* | 6/2016 | Kim | H01L 27/3276 257/40 |
| 2016/0307976 A1* | 10/2016 | You | H01L 27/3246 |
| 2016/0372498 A1* | 12/2016 | Ahn | H01L 27/1288 |

\* cited by examiner

METHOD OF FORMING A CONDUCTIVE
PATTERN AND METHOD OF
MANUFACTURING AN ORGANIC
LIGHT-EMITTING DISPLAY INCLUDING
THE SAME

CROSS-REFERENCE TO RELATED
APPLICATIONS

This application claims priority to and the benefit of Korean Patent Application No. 10-2016-0010172, filed on Jan. 27, 2016 in the Korean Intellectual Property Office, the disclosure of which is incorporated by reference herein in its entirety.

TECHNICAL FIELD

The described technology relates to a conductive pattern. More particularly, the described technology relates to a method of forming a conductive pattern and a method of manufacturing an organic light-emitting display device including the conductive pattern.

DISCUSSION OF RELATED ART

Organic light-emitting display devices include an organic light emitting diode (OLED) having a hole injection electrode, an electron injection electrode, and an organic emission layer disposed between the hole injection electrode and the electron injection electrode. In addition, organic light-emitting display devices are self-emissive. In the organic emission layer, holes injected through the hole injection electrode and electrons injected through the electron injection electrode combine with each other to generate excitons of atoms that fall from an excited state to a ground state thereby generating light.

Organic light-emitting display devices do not need a light source and thus are driven with a low voltage. Organic light-emitting display devices are also lightweight and thin. In addition, since the organic light-emitting display devices may have a wide viewing angle, a high contrast, and a fast response time, organic light-emitting display devices are applied to personal portable electronic devices and, more recently, to televisions.

SUMMARY

Embodiments of the present invention provide a method of forming a conductive pattern that may be protected by an insulating layer by using a single mask. Embodiments of the present invention further include an organic light-emitting display device which may be capable of realizing a high resolution at a lower cost and a method of manufacturing the organic light-emitting display device.

According to an exemplary embodiment of the present invention, a method of forming a conductive pattern is provided. According to the method, a conductive material layer for forming the conductive pattern is formed on a substrate. A photosensitive organic material layer is formed on the conductive material layer. The photosensitive organic material layer is irradiated through a halftone mask. The halftone mask includes a first mask region having a boundary corresponding to an edge of the conductive pattern, a second mask region, and a third mask region disposed between the first mask region and the second mask region. A first pattern including a first region corresponding to the first mask region and having a first thickness and a second region corresponding to the third mask region and having a second thickness smaller than the first thickness is formed by removing the photosensitive organic material layer. The conductive material layer is etched using the first pattern as a hard mask and forms the conductive pattern arranged below the first pattern and has exposed lateral surfaces. A second pattern that covers the lateral surfaces of the conductive pattern is formed by reflowing the first pattern.

The third mask region may be disposed along the boundary of the first mask region. The third mask region may surround the first mask region.

The etching of the conductive material layer may include exposing a portion of a lower surface of the second region of the first pattern.

The edge of the conductive pattern may be indented with respect to an edge of the first pattern.

The removing of the photosensitive organic material layer may include fully removing a first portion of the photosensitive organic material layer corresponding to the second mask region. The removing of the photosensitive organic material layer may also include partially removing a second portion of the photosensitive organic material layer corresponding to the third mask region.

The forming of the second pattern may include flowing a portion of the first pattern along the lateral surfaces of the conductive pattern to cover the lateral surfaces of the conductive pattern.

The conductive pattern may have an exposed region. An upper surface of the exposed region of conductive pattern might not be covered with the second pattern. The halftone mask may further include a fourth mask region corresponding to the exposed region of the conductive pattern inside the first mask region. The first pattern may further have a third region having a third thickness smaller than the first thickness in correspondence with the fourth mask region, inside the first region.

An average thickness of the third region may be less than an average thickness of the second region.

The first pattern may be ashed such that an upper surface of the exposed region of the conductive pattern may be exposed.

According to an exemplary embodiment of the present invention, a method of manufacturing a display device is provided. According to the method, a thin film transistor is formed on a substrate. A via insulating layer that covers the thin film transistor is formed. A conductive material layer for forming a pixel electrode is formed on the via insulating layer. A photosensitive organic material layer is formed on the conductive material layer. The photosensitive organic material layer is irradiated through a halftone mask. The halftone mask includes a first mask region corresponding to a light-emission region of the pixel electrode and a second mask region surrounding the first mask region. The second mask region has an outer boundary corresponding to an edge of the pixel electrode. The halftone mask further includes a third mask region and a fourth mask region disposed between the second mask region and the third mask region. The photosensitive organic material layer is removed to form a first pattern. The first pattern includes a first region corresponding to the first mask region and having a first thickness and a second region having a second thickness greater than the first thickness. The first pattern further includes a third region corresponding to the fourth mask region and having a third thickness smaller than the second thickness. The conductive material layer is etched using the first pattern as a hard mask in forming the pixel electrode arranged below the first pattern and has exposed lateral surfaces. A portion of the first pattern is removed to form a second pattern through which an upper surface of the light-emission region of the pixel electrode is exposed. The second pattern is reflowed to form a pixel defining layer. The pixel defining layer exposes the light-emission region of the pixel electrode and covers the lateral surfaces of the pixel electrode.

The fourth mask region may be disposed along the outer boundary of the second mask region. The fourth mask region may surround the second mask region.

The etching of the conductive material layer may include exposing a portion of a lower surface of the third region of the first pattern.

The edge of the pixel electrode may be indented with respect to an edge of the first pattern.

An average thickness of the first region may be less than an average thickness of the third region.

The removing of the photosensitive organic material layer may include partially removing regions of the photosensitive organic material layer corresponding to the first and fourth mask regions. The removing of the photosensitive organic material layer may also include fully removing a region of the photosensitive organic material layer corresponding to the third mask region.

The forming of the second pattern may include ashing the first pattern so that the third region is removed.

The reflowing of the second pattern may include flowing a portion of the second pattern along the lateral surfaces of the pixel electrode to cover the lateral surfaces of the pixel electrode.

The organic emission layer may be formed on the light-emission region of the pixel electrode. An opposite electrode may be formed on the organic emission layer and the pixel defining layer.

A thin-film encapsulation layer may be formed on the opposite electrode. The thin-film encapsulation layer may include at least one inorganic layer and at least one organic layer.

According to an exemplary embodiment of the present invention, a method of manufacturing a display device is provided. According to the method, a thin film transistor is formed on a substrate. A via insulating layer that covers the thin film transistor is formed. A conductive material layer for forming a pixel electrode having a center region is formed on the via insulating layer. A photosensitive organic material layer are formed on the conductive material layer. The photosensitive organic material layer is irradiated through a halftone mask. The photosensitive organic material layer is removed to form a first pattern. The first pattern includes a first region having a first thickness and a second region having a second thickness greater than the first thickness. The first pattern further includes a third region having a third thickness smaller than the second thickness. The conductive material layer is etched using the first pattern as a hard mask in forming the pixel electrode arranged adjacent to the first pattern. A portion of the first pattern is removed to form a second pattern through which an upper surface of the center region of the pixel electrode is exposed. The second pattern is reflowed to form a pixel defining layer. The pixel defining layer exposes the center region of the pixel electrode and covers lateral surfaces of the pixel electrode. The reflowing of the second pattern includes covering the lateral surfaces of the pixel electrode by flowing a portion of the second pattern along the lateral surfaces of the pixel electrode.

BRIEF DESCRIPTION OF THE DRAWINGS

These and/or other aspects will become apparent and more readily appreciated from the following description of exemplary embodiments, taken in conjunction with the accompanying drawings in which.

DETAILED DESCRIPTION OF THE EMBODIMENTS

Figure 1A:
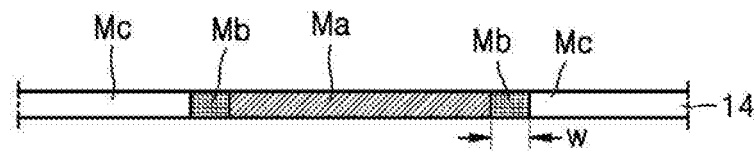
FIGS. 1A to 1D are cross-sectional views illustrating a method of forming a conductive pattern according to an exemplary embodiment of the present invention.
Figure 1A:
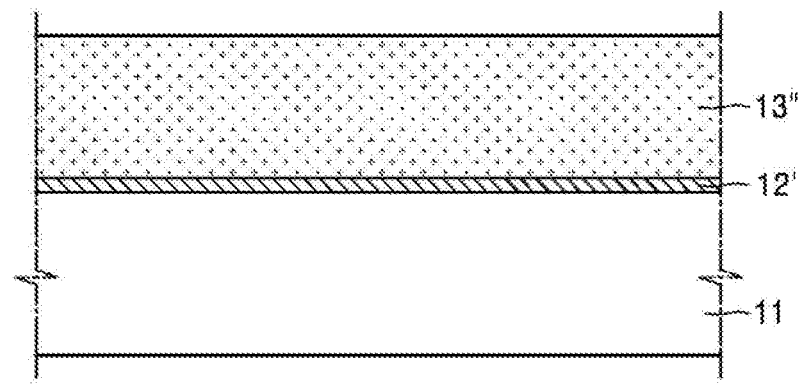

As the present invention allows for various changes and numerous embodiments, exemplary embodiments of the present invention will be illustrated in the drawings and described in detail herein. Hereinafter, aspects and features of embodiments of the present invention and a method for accomplishing them will be described more fully with reference to the accompanying drawings; however, the present invention may be embodied in many different forms and should not be construed as limited to the exemplary embodiments set forth herein.

It will be understood that when a layer, region, or component is referred to as being "formed on" or "disposed on" another layer, region, or component, it can be directly or indirectly formed or disposed on the other layer, region, or component. Therefore, intervening layers, regions, or components may be present.

Sizes of elements in the drawings may be exaggerated for convenience of explanation and the following embodiments of the present invention are not limited thereto.

Embodiments of the present invention will be described below in more detail with reference to the accompanying drawings. Those components that are the same or are similar to components in other figures may be referred to by the same reference numeral regardless of the figure number and redundant explanations may be omitted.

FIGS. 1A to 1D are cross-sectional views illustrating a method of forming a conductive pattern according to an exemplary embodiment of the present invention.

Figure 1B:
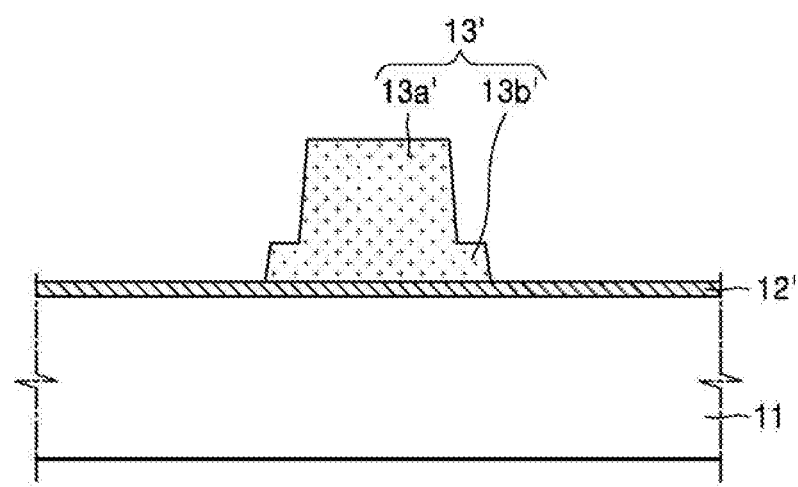
Figure 1C:
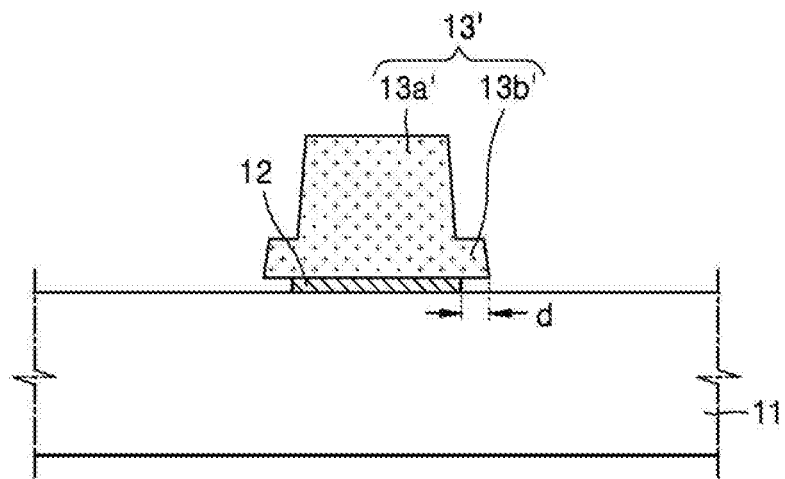
Figure 1D:
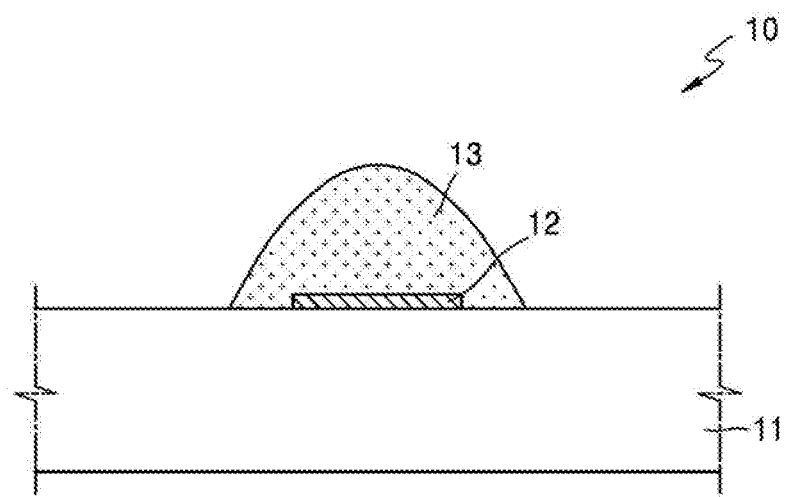

Referring to FIG. 1D, a device 10 is disposed on a substrate 11. The device 10 includes a conductive pattern 12. The conductive pattern 12 is covered with an organic insulating layer 13.

The conductive pattern 12 may be disposed on the substrate 11. The organic insulating layer 13 may cover an upper surface and lateral surfaces of the conductive pattern 12. The device 10 may be an organic light-emitting display.

The substrate 11 may include a thin film transistor disposed on a base substrate. The thin film transistor may include an active layer formed of a semiconductor material. The active layer may include a source region, a drain region, and a channel region disposed between the source region and drain region. The thin film transistor may include a gate electrode at least partially overlapping with the channel region of the active layer. The substrate 11 may include a gate insulating layer that may insulate the active layer from the gate electrode. The substrate 11 may be a component of an organic light-emitting display device.

The conductive pattern 12 may include a single layer or may include multiple layers of, for example, transparent conductive oxide and/or metal. The organic insulating layer 13 may include a photosensitive organic material that is insulating.

The conductive pattern 12 may include a source electrode and a drain electrode of an organic light-emitting display device or may include a wiring disposed on substantially the same layer on which the source electrode and the drain electrode are disposed on. The source electrode and the drain electrode may be respectively electrically connected to the source region and the drain region of the active layer within the substrate 11. The substrate 11 may include an interlayer insulating layer that may insulate the gate electrode from the conductive pattern 12. The organic insulating layer 13 may insulate the conductive pattern 12 from another conductive pattern that may be formed by a different process.

The substrate 11 may include the source electrode and the drain electrode electrically connected to the source region and the drain region of the active layer, respectively. The substrate 11 may also include an interlayer insulating layer that may insulate the gate electrode from either or both of the source electrode and the drain electrode. The substrate 11 may also include a via insulating layer that may cover the thin film transistor. The via insulating layer may have a planarized upper surface and may include a single layer or multiple layers formed of an organic material. The conductive pattern 12 may be a pixel electrode of an organic light-emitting display device or a wiring disposed on substantially the same layer on which the pixel electrode is disposed. The organic insulating layer 13 may insulate the conductive pattern 12 from a conductive material layer that may be formed by a different process.

In general, to form the conductive pattern 12 covered with the organic insulating layer 13 on the substrate 11, a first mask for patterning the conductive pattern 12 and a second mask for patterning the organic insulating layer 13 covering the conductive pattern 12 may be used. According to a method, after the organic insulating layer 13 is formed, the conductive pattern 12 may be formed using the organic insulating layer 13 as a hard mask. Therefore, only one mask may be needed to form the organic insulating layer 13. However, in so doing, the lateral surfaces of the conductive pattern 12 may be exposed. To cover the lateral surfaces of the conductive pattern 12, the organic insulating layer 13 may undergo reflow. However, since volume shrinkage may occur during reflow of an organic insulating material, the lateral surfaces of the conductive pattern 12 may remain partially exposed.

Exemplary embodiments of the present invention may provide a method of forming a conductive pattern 12 on the substrate 11, in which the lateral surfaces and an upper surface of the conductive pattern 12 are covered with the organic insulating layer 13 by using a single mask.

Referring to FIG. 1A, a conductive material layer 12' and a photosensitive organic material layer 13" may be sequentially formed on the substrate 11.

The conductive material layer 12' may include at least one transparent conductive oxide selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The conductive material layer 12' may also include at least one metal selected from the group consisting of silver (Ag), magnesium (Mg), aluminum (Al), platinum (Pt), palladium (Pd), gold (Au), nickel (Ni), neodymium (Nd), iridium (Ir), and chromium (Cr).

The photosensitive organic material layer 13" may include a photosensitive organic material that is insulating. The photosensitive organic material may include a solvent to enable the photosensitive organic material to be reflowed by applying, for example, heat or infrared rays thereto. The photosensitive organic material may include, for example, an olefin-based organic material, an acryl-based organic material, or an imide-based organic material. For example, the photosensitive organic material may include polyimide (PI). The photosensitive organic material may be a positive photosensitive material of which a portion exposed to light may be removed. The photosensitive organic material may alternatively be a negative photosensitive material of which a portion not exposed to light may be removed.

Light may be radiated to the photosensitive organic material layer 13" and a halftone mask 14 may be used to block and transmit light according to a desired pattern. The halftone mask 14 may include a first mask region Ma, a second mask region Mc, and a third mask region Mb. The first mask region Ma may correspond to the conductive pattern 12 of FIG. 1D. The second mask region Mc may correspond to a region of the substrate 11 from which the conductive material layer 12' may be removed, for example, a region of the substrate 11 on which the conductive pattern 12 might not be disposed. The third mask region Mb may be disposed between the first mask region Ma and the second mask region Mc. A light transmittance of the third mask region Mb may be between a light transmittance of the first mask region Ma and a light transmittance of the second mask region Mc.

The third mask region Mb may be disposed along an output boundary of the first mask region Ma to surround the first mask region Ma. The output boundary of the first mask region Ma may be defined as a boundary between the first mask region Ma and the third mask region Mb.

According to an embodiment of the present invention, when the photosensitive organic material layer 13" includes a positive photosensitive material, the first mask region Ma may block substantially all light, the second mask region Mc may transmit substantially all light, and the third mask region Mb may transmit a portion of light. Therefore, the light transmittance of the third mask region Mb may be higher than the light transmittance of the first mask region Ma and the light transmittance of the third mask region Mb may be lower than the light transmittance of the second mask region Mc.

According to an embodiment of the present invention, when the photosensitive organic material layer 13" includes a negative photosensitive material, the first mask region Ma may transmit substantially all light, the second mask region Mc may block substantially all light, and the third mask region Mb may transmit a portion of light. Therefore, the light transmittance of the third mask region Mb may be lower than the light transmittance of the first mask region Ma and the light transmittance of the third mask region Mb may be higher than the light transmittance of the second mask region Mc.

Referring to FIGS. 1A and 1B, a portion of the photosensitive organic material layer 13" irradiated with light through the halftone mask 14 may be removed. The photosensitive organic material layer 13" may undergo a developing process prior to removal. A portion of the photosensitive organic material layer 13" corresponding to the third mask region Mb may be partially removed and a portion of the photosensitive organic material layer 13" corresponding to the second mask region Mc may be substantially completely removed.

As a portion of the photosensitive organic material layer 13" is removed, a first pattern 13' including a first region 13a' and a second region 13b' may accordingly be formed.

The first region 13a' may correspond to the first mask region Ma and the second region 13b' may correspond to the third mask region Mb. Since the portion of the photosensitive organic material layer 13" corresponding to the first mask region Ma might not be substantially removed and the portion of the photosensitive organic material layer 13" corresponding to the third mask region Mb may be partially removed, the first region 13a' may be thicker than the second region 13U.

Referring to FIG. 1C, the conductive pattern 12 may be formed by wet etching the conductive material layer 12' of FIG. 1B by using the first pattern 13' as a hard mask. The conductive pattern 12 may be disposed below the first pattern 13' and the lateral surfaces of the conductive pattern 12 may be exposed.

The conductive material layer 12' of FIG. 1B may be etched using the first pattern 13 as a hard mask. Accordingly, a lower surface of a portion of the second region 13b' of the first pattern 13' may be exposed. The portion of the second region 13b' having the lower surface exposed may be positioned on a void. For example, an edge of the conductive pattern 12 may be indented from an edge of the first pattern 13' by a distance d. The distance d may be about 0.7 μm or greater. For example, the distance d may be about 2 μm or less.

Referring to FIGS. 1C and 1D, the organic insulating layer 13 covering the upper surface and the lateral surfaces of the conductive pattern 12 may be formed by reflowing the first pattern 13'. The organic insulating layer 13 may be referred to as a second pattern.

The first pattern 13' may be thermally reflowed by applying, for example, heat or infrared rays. To perform a reflow process, the substrate 11 including the first pattern 13' may be disposed on a hot plate. Since the hot plate delivers heat upwards from the substrate 11, a portion of the second region 13b' of the first pattern 13' may flow along the lateral surfaces of the conductive pattern 12. The reflow process may also be performed by heating the substrate 11 including the first pattern 13' within an oven or irradiating the substrate 11 including the first pattern 13' with infrared rays.

When the lateral surfaces of the conductive pattern 12 are exposed a short-circuit may occur between the conductive pattern 12 and another conductive pattern formed by a different process. According to an embodiment of the present invention, the organic insulating layer 13 covering the lateral surfaces of the conductive pattern 12 may be formed by reflowing the first pattern 13'. Therefore, the conductive pattern 12 and the organic insulating layer 13 covering the upper surface and the lateral surfaces of the conductive pattern 12 may be formed using a single mask according to an embodiment of the present invention. Thus, manufacturing costs may be reduced and a manufacturing process may be simplified, which may lead to a reduction in processing time.

Referring to FIGS. 1A and 1C, the first pattern 13' may be formed from the photosensitive organic material layer 13" which may include a photosensitive organic material and a solvent. When the first pattern 13' is heated to undergo a reflow process, the solvent within the photosensitive organic material may be removed and at substantially the same time the volume of the first pattern 13' may shrink. In particular, the first region 13a' of the first pattern 13', that is relatively thick, may receive a strong shrinkage force during the volume shrinkage. If the first pattern 13' includes only a thick portion, the first pattern 13 may be moved inwards due to the strong shrinkage force and the first pattern 13' may fail to cover the lateral surfaces of the conductive pattern 12 due to a surface tension of the reflowed first pattern 13'. When the first pattern 13' including only a thick portion is melted due to reflow, the melted first pattern 13' may break and at substantially the same time a void may be generated on the lateral surfaces of the conductive pattern 12.

According to an embodiment of the present invention, as shown in FIG. 1B, the first pattern 13' may include the first region 13a' and the second region 13b' may be positioned outside the first region 13a' and may be relatively thick. The second region 13b' of the first pattern 13' may receive a weak shrinkage force compared to the shrinkage force received by the first region 13a' because the second region 13b' may be relatively thin. Furthermore, since the second region 13b' may be thin, the second region 13b' may melt prior to the first region 13a' due to reflow. Since a space below a portion of the second region 13b' may be empty, when a reflow process starts, the portion of the second region 13b' may melt first and thus may flow along the lateral surfaces of the conductive pattern 12 or may cover the lateral surfaces of the conductive pattern 12 due to gravity. Consequently, due to the second region 13b' of the first pattern 13' being thin, the lateral surfaces of the conductive pattern 12 may be completely covered with the organic insulating layer 13. Thus, a short-circuit between another conductive pattern formed by a different process and the lateral surfaces of the conductive pattern 12 may be prevented.

FIGS. 2A to 2E are cross-sectional views illustrating a method of forming a conductive pattern according to an embodiment of the present invention.

Figure 2A:
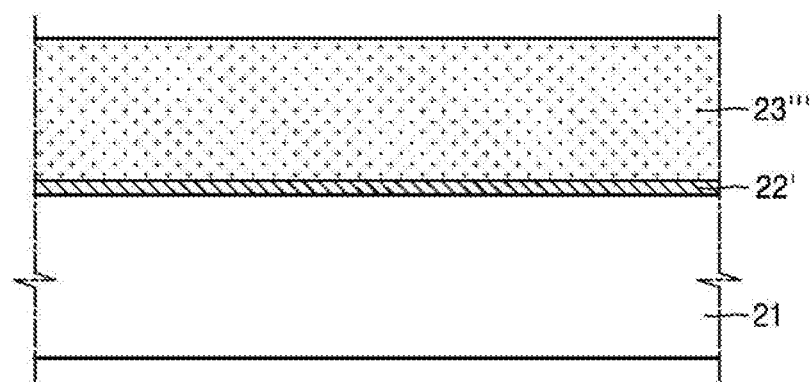
FIGS. 2A to 2E are cross-sectional views illustrating a method of forming a conductive pattern according to an exemplary embodiment of the present invention.
Figure 2B:
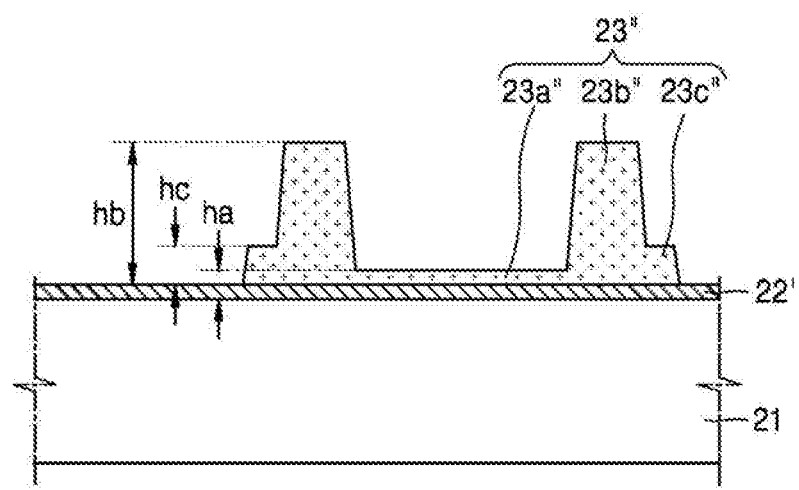
Figure 2C:
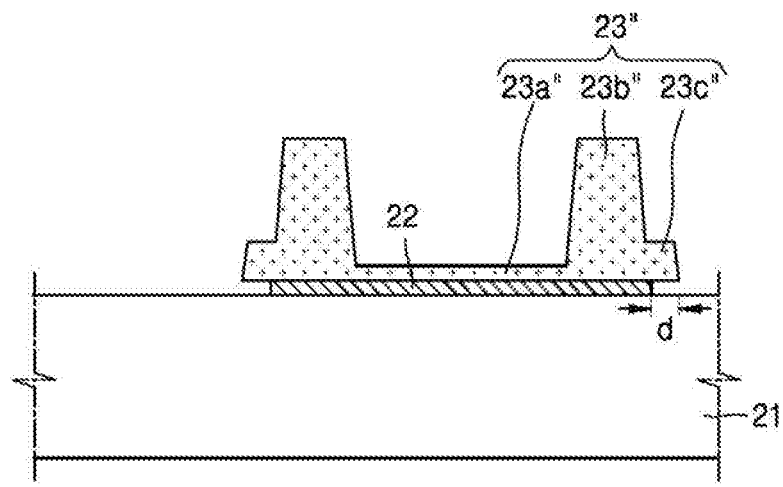
Figure 2D:
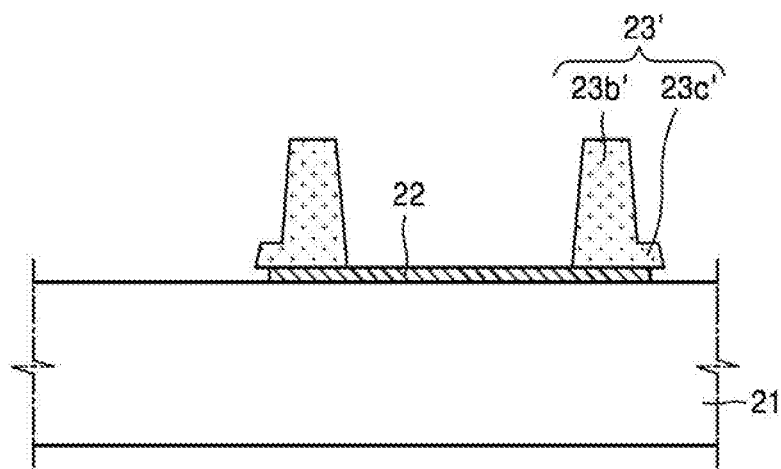
Figure 2E:
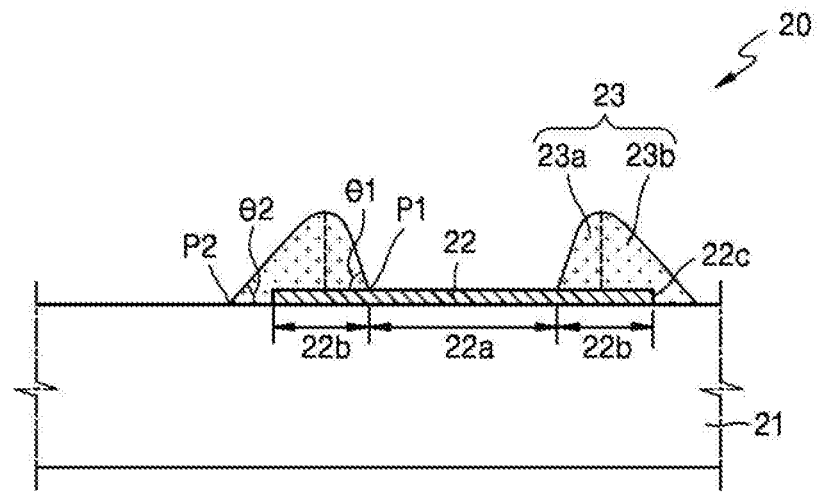

Referring to FIG. 2E, a device 20 is disposed on a substrate 21. The device 20 includes a conductive pattern 22. The conductive pattern 22 has an edge region, which is covered with an organic insulating layer 23.

The device 20 may include the substrate 21. The conductive pattern 22 may be disposed on the substrate 21. The conductive pattern 12 may have a center region 22a and an edge region 22b disposed around the center region 22a. An organic insulating layer 23 may expose the center region 22a of the conductive pattern 22. The organic insulating layer 23 may also cover the edge region 22b and lateral surfaces of the conductive pattern 22. The organic insulating layer 23 may include a first inclined portion 23a inclined toward the center region 22a of the conductive pattern 22 and a second inclined portion 23b inclined in a different direction from the first inclined portion 23a. An end 22c of the conductive pattern 22 may be positioned between the substrate 21 and the second inclined portion 23b. The device 20 may be an organic light-emitting display.

The substrate 21 may include a thin film transistor disposed on a base substrate. The thin film transistor may include an active layer formed of a semiconductor material. The active layer may include a source region, a drain region, and a channel region disposed between the source region and drain region. The thin film transistor may also include a gate electrode at least partially overlapping with the channel region of the active layer. The substrate 21 may include a gate insulating layer that may insulate the active layer from the gate electrode. The substrate 21 may include a source electrode and a drain electrode respectively electrically connected to the source region and the drain region of the active layer. The substrate 21 may also include an interlayer insulating layer that may insulate the gate electrode from the source electrode and the drain electrode. The substrate 21 may include a via insulating layer that may cover the thin film transistor. The via insulating layer may have a planarized upper surface and may include a single layer or may include multiple layers formed of an organic material. The substrate 21 may be flexible and may be easily bent, folded, or rolled. The substrate 21 may be a component of an organic light-emitting display device.

The conductive pattern 22 may include a single layer or may include multiple layers of, for example, transparent conductive oxide and/or metal. The conductive pattern 22 may include at least one transparent conductive oxide selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The conductive pattern 22 may include at least one metal selected from the group consisting of silver (Ag), magnesium (Mg), aluminum (Al), platinum (Pt), palladium (Pd), gold (Au), nickel (Ni), neodymium (Nd), iridium (Ir), and chromium (Cr).

The conductive pattern 22 may include the center region 22a that is exposed and is not covered with the organic insulating layer 23. The conductive pattern 22 may further include the edge region 22b positioned around the center region 22a and the edge region 22b may be covered with the organic insulating layer 23.

The organic insulating layer 23 may expose the center region 22a of the conductive pattern 22 and cover the edge region 22b and the lateral surfaces of the conductive pattern 22. The organic insulating layer 23 may include a first inclined portion 23a inclined toward the center region 22a of the conductive pattern 22 and a second inclined portion 23b inclined in a different direction from the first inclined portion 23a. A thickness of the first inclined portion 23a may increase from a region P1 on the conductive pattern 22 toward the end 22c of the conductive pattern 22. The region P1 on the conductive pattern 22 may be defined as a boundary between the center region 22a and the edge region 22b of the conductive pattern 22. A thickness of the second inclined portion 23b may decrease from the first inclined portion 23a toward a region P2 on an upper surface of the substrate 21. The second inclined portion 23b may have a different inclination direction than that of the first inclined portion 23a. The boundary between the first inclined portion 23a and the second inclined portion 23b may be defined as a region having a largest height in a vertical cross-section. For example, the boundary between the first inclined portion 23a and the second inclined portion 23b may be defined as a region having an upper surface parallel to the substrate 21.

An upper surface of the first inclined portion 23a may extend from the region P1 on the conductive pattern 22 in a direction away from the substrate 21. For example, the first inclined portion 23a may have a cross-section of which a height increases from the region P1 to the boundary between the first inclined portion 23a and the second inclined portion 23b. An upper surface of the second inclined portion 23b may extend from the first inclined portion 23a to the region P2 on the substrate 21 in a direction toward the substrate 21. For example, the second inclined portion 23b may have a cross-section of which a height decreases from the boundary between the first inclined portion 23a and the second inclined portion 23b to the substrate 21.

The organic insulating layer 23 may be disposed such that an upper surface of the center region 22a of the conductive pattern 22 is exposed and an upper surface of the edge region 22b of the conductive pattern 22 and the lateral surfaces of the conductive pattern 22 are covered. The organic insulating layer 23 may include a photosensitive organic material that is insulating.

A portion of a lower surface of the organic insulating layer 23 may directly contact an upper surface of the conductive pattern 22 and the remaining portion thereof may directly contact the upper surface of the substrate 21. The portion of the lower surface of the organic insulating layer 23 directly contacting the upper surface of the conductive pattern 22 may have a larger area than the remaining portion directly contacting the upper surface of the substrate 21.

Figure 3:
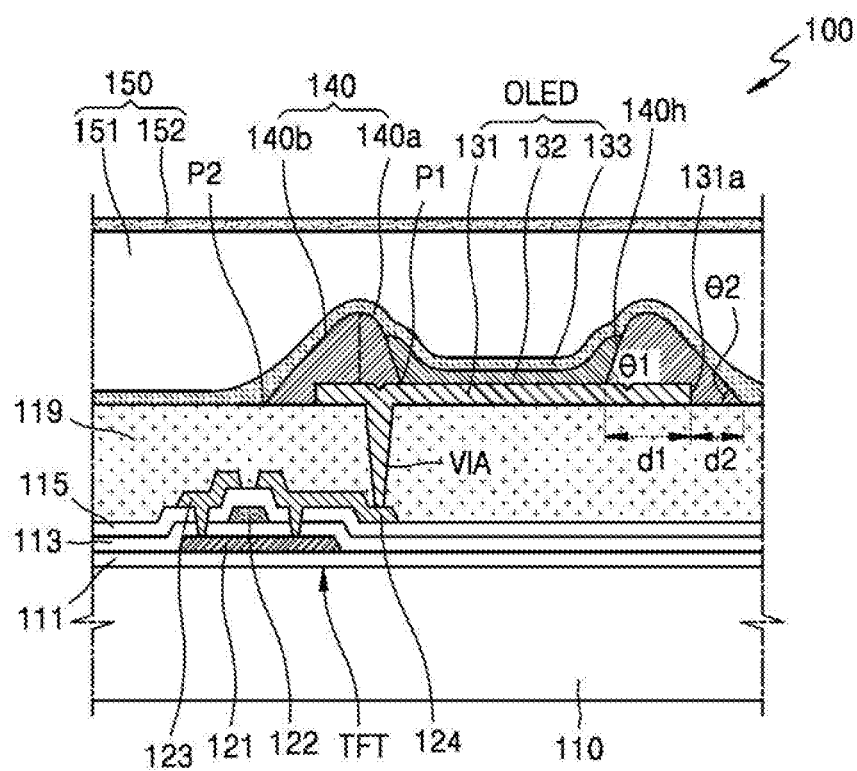
FIG. 3 is a cross-sectional view of an organic light-emitting display according to an exemplary embodiment of the present invention.

The edge region 22b of the conductive pattern 22 may be interposed between the first inclined portion 23a of the organic insulating layer 23 and the substrate 21 and may also be interposed between at least a portion of the second inclined portion 23b of the organic insulating layer 23 and the substrate 21. For example, the end 22c of the conductive pattern 22 may be positioned between the substrate 21 and the second inclined portion 23b. As shown in FIG. 3, a distance d1 from the region P1 on the conductive pattern 22 to the end 22c of the conductive pattern 22 may be greater than a distance d2 from the end 22c of the conductive pattern 22 to the region P2 on the end 22c of the conductive pattern 22.

According to an embodiment of the present invention, a first angle $\theta 1$ between the upper surface of the conductive pattern 22 and an upper surface of the first inclined portion 23a may be greater than a second angle $\theta 2$ between the upper surface of the substrate 21 and an upper surface of the second inclined portion 23b. For example, the first angle $\theta 1$ may be less than about 55° and the second angle $\theta 2$ may be about 35°. A difference between the first angle $\theta 1$ and the second angle $\theta 2$ may be about 5° or greater.

An angle of inclination of the upper surface of the first inclined portion 23a with respect to the upper surface of the conductive pattern 22 may vary according to locations on the first inclined portion 23a. An angle of inclination of the upper surface of the second inclined portion 23b with respect to the upper surface of the conductive pattern 22 may also vary according to locations on the second inclined portion 23b. The first angle $\theta 1$ may denote an angle of inclination of the upper surface of the first inclined portion 23a at the region P1 on the conductive pattern 22 and the second angle $\theta 2$ may denote an angle of inclination of the upper surface of the second inclined portion 23b at the region P2 on the substrate 21.

The conductive pattern 22 may be a pixel electrode of an organic light-emitting display device or wiring disposed on substantially the same layer as the layer on which the pixel electrode is disposed. An organic emission layer may be disposed on the center region 22a of the conductive pattern 22. The organic insulating layer 23 may insulate the lateral surfaces of the conductive pattern 22 from a conductive material layer that may be formed by a different process.

In general, in order to form the conductive pattern 22 disposed on the substrate 21 including the center region 22a exposed and the edge region 22b around the center region 22a and lateral surfaces covered with the organic insulating layer 23, a first mask for patterning the conductive pattern 22 on the substrate 21 and a second mask for patterning the organic insulating layer 23 covering the edge region 22b and the lateral surfaces of the conductive pattern 22 may be needed. An organic insulating pattern may be formed using a single halftone mask, the conductive pattern 22 may be patterned using the organic insulating pattern as a hard mask and a portion of the organic insulating pattern may be removed to expose the center region 22a, thereby forming a structure including the conductive pattern 22 and the organic insulating layer 23 exposing the center region 22a of the conductive pattern 22 and covering the edge region 22b of the conductive pattern 22. In this method, only one halftone mask may be needed, but the lateral surfaces of the conductive pattern 22 may be exposed. Although the organic insulating layer 23 may be reflowed to cover the lateral surfaces of the conductive pattern 22, since volume shrinkage may occur during reflow of an organic insulating material, a portion of the lateral surfaces of the conductive pattern 22 may be exposed.

According to an embodiment of the present invention, a method of forming the conductive pattern 22 on the substrate 21 and the organic insulating layer 23 exposing the center region 22a of the conductive pattern 22 and covering the edge region 22b and the lateral surfaces of the conductive pattern 22 by using a single halftone mask may be provided.

Referring to FIG. 2A, a conductive material layer 22' and a photosensitive organic material layer 23''' may be sequentially formed on the substrate 21.

The conductive material layer 22' may include at least one transparent conductive oxide selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The conductive material layer 22' may further include metal, such as silver (Ag), magnesium (Mg), aluminum (Al), platinum (Pt), palladium (Pd), gold (Au), nickel (Ni), neodymium (Nd), iridium (Ir), or chromium (Cr). The conductive material layer 22' may include a single layer or may include multiple layers.

The photosensitive organic material layer 23'' may include a photosensitive organic material that is insulating. The photosensitive organic material may include a solvent to enable the photosensitive organic material to be reflowed by applying, for example, heat or infrared rays thereto. The photosensitive organic material may include, for example, an olefin-based organic material, an acryl-based organic material, or an imide-based organic material. For example, the photosensitive organic material may include polyimide (PI). The photosensitive organic material may be a positive photosensitive material of which a portion exposed to light may be removed. The photosensitive organic material may alternatively be a negative photosensitive material of which a portion not exposed to light may be removed.

Light may be radiated to the photosensitive organic material layer 23''' and a halftone mask 24 may be used to block and transmit light according to a desired pattern. The halftone mask 24 may include a first mask region Ma, a second mask region Mb, a third mask region Md, and a fourth mask region Mc. The first mask region Ma may correspond to the center region 22a of the conductive pattern 22 of FIG. 2E. The second mask region Mb may have an outer boundary that surrounds the first mask region Ma and corresponds to an edge of the conductive pattern 22. The third mask region Md may correspond to a region of the substrate 21 from which the conductive material layer 22' may be removed, for example, a region of the substrate 21 on which the conductive pattern 22 might not be disposed. The fourth mask region Mc may be disposed between the second mask region Mb and the third mask region Md.

The fourth mask region Mc may be disposed along the output boundary of the second mask region Mb to surround the second mask region Mb. Therefore, the output boundary of the second mask region Mb may be defined as a boundary between the second mask region Mb and the fourth mask region Mc.

According to an embodiment of the present invention, when the photosensitive organic material layer 23'' includes a positive photosensitive material, the first mask region Ma may transmit a portion of light, the second mask region Mb may block light, the third mask region Md may transmit light, and the fourth mask region Mc may transmit a portion of light. Therefore, a light transmittance of the first mask region Ma may be higher than a light transmittance of the fourth mask region Mc.

According to an embodiment of the present invention, when the photosensitive organic material layer 23'' includes a negative photosensitive material, the first mask region Ma may transmit a portion of light, the second mask region Mb may transmit substantially all light, the third mask region Md may block substantially all light, and the fourth mask region Mc may transmit a portion of light. Therefore, a light transmittance of the fourth mask region Mc may be higher than a light transmittance of the first mask region Ma.

Referring to FIGS. 2A and 2B, a portion of the photosensitive organic material layer 23''' irradiated with light through the halftone mask 24 may be removed. The photosensitive organic material layer 23'' may undergo a developing process prior to removal. Portions of the photosensitive organic material layer 23''' corresponding to the first mask region Ma and fourth mask region Mc may be partially removed and a portion of the photosensitive organic material layer 23''' corresponding to the third mask region Md may be substantially completely removed.

As a portion of the photosensitive organic material layer 23''' is removed, a first pattern 23'' including a first region 23a'', a second region 23b'', and a third region 23c'' may be accordingly formed.

The first region 23a'' having a first thickness ha may correspond to the first mask region Ma. The second region 23b'' having a second thickness hb may correspond to the second mask region. The third region 23c'' having a third thickness hc may correspond to the fourth mask region Mc. Since the portions of the photosensitive organic material layer 23''' corresponding to the first mask region Ma and fourth mask region Mc may be partially removed, but a portion of the photosensitive organic material layer 23''' corresponding to the second mask region Mb might not be substantially removed, the second thickness hb of the second region 23b'' may be greater than the first thickness ha and the second thickness hb of the second region 23b'' may be greater than the third thickness hc. Accordingly, the third thickness hc of the third region 23c'' may be smaller than the second thickness hb.

When the photosensitive organic material layer 23' includes a positive photosensitive material, the light transmittance of the first mask region Ma may be higher than the light transmittance of the fourth mask region Mc. When the photosensitive organic material layer 23'' includes a negative photosensitive material, the light transmittance of the fourth mask region Mc may be higher than the light transmittance of the first mask region Ma. Accordingly, the portion of the photosensitive organic material layer 23''' corresponding to the first mask region Ma may be removed to a greater extent than the portion of the photosensitive organic material layer 23' corresponding to the fourth mask region Mc. Consequently, more of the portion of the photosensitive organic material layer 23'' corresponding to the fourth mask region Mc may remain than the portion of the photosensitive organic material layer 23''' corresponding to the first mask region Ma and the third thickness hc of the third region 23c" may be greater than the first thickness ha of the first region 23a". As such, an average thickness of the first region 23a" may be less than an average thickness of the third region 23c".

Referring to FIG. 2C, the conductive pattern 22 may be formed by wet etching the conductive material layer 22' of FIG. 2B by using the first pattern 23" as a hard mask. The conductive pattern 22 may be disposed below the first pattern 23" and lateral surfaces of the conductive pattern 22 may be exposed.

The conductive material layer 22' of FIG. 2B may be etched using the first pattern 23" as a hard mask. Accordingly, a lower surface of a portion of the third region 23c" of the first pattern 23" may be exposed. The portion of the third region 23c" having the lower surface exposed may be positioned on a void. For example, an edge of the conductive pattern 22 may be indented from an edge of the first pattern 23" by a distance d. The distance d may be about 0.7 μm or greater. For example, the distance d may be about 2 μm or less.

Referring to FIGS. 2C and 2D, a portion of the first pattern 23" may be removed so that the center region 22a of FIG. 2E of the conductive pattern 22 may be exposed. For example, ashing may be performed on the first pattern 23" and thus the thickness of the first pattern 23" may decrease. For example, by ashing, the first region 23a" of the first pattern 23" may be completely removed and thus an upper surface of the center region 22a of FIG. 2E of the conductive pattern 22 covered with the first region 23a" may be exposed. When the first region 23a" of the first pattern 23" is removed, the second region 23b" and the third region 23c" of the first pattern 23" may also be removed, but since the second region 23b" and the third region 23c" may be thicker than the first region 23a", the second region 23b" and the third region 23c" might not be completely removed.

Consequently, a second pattern 23' exposing the upper surface of the center region 22a of FIG. 2E of the conductive pattern 22 may be formed. A first portion 23b' of the second pattern 23' may correspond to a portion that remains after the second region 23b" of the first pattern 23" is partially removed by, for example, ashing. A second portion 23c' of the second pattern 23' may correspond to a portion that remains after the third region 23c" of the first pattern 23" is partially removed by, for example, ashing. The second pattern 23' may cover the edge region 22b of FIG. 2E of the conductive pattern 22 and the lateral surfaces of the conductive pattern 22 may be exposed.

Referring to FIGS. 2D and 2E, the organic insulating layer 23 covering the lateral surfaces or the end 22c of the conductive pattern 22 may be formed by reflowing the second pattern 23'. The organic insulating layer 23 may expose the center region 22a of the conductive pattern 22 and may cover the edge region 22b and the lateral surfaces of the conductive pattern 22.

The second pattern 23' may be thermally reflowed by, for example, by applying heat or infrared rays. To perform a reflow process, the substrate 21 including the second pattern 23' may be disposed on a hot plate. Since the hot plate delivers heat upwards from the substrate 21, a portion of the second region 23c' of the second pattern 23' may flow along the lateral surfaces of the conductive pattern 22. The reflow process may also be performed by heating the substrate 21 including the second pattern 23' within an oven or irradiating the substrate 21 including the second pattern 23' with infrared rays.

When the end 22c of the conductive pattern 22 is exposed, a short-circuit may occur between the conductive pattern 22 and a conductive material layer formed by a different process. According to an embodiment of the present invention, the organic insulating layer 23 covering the lateral surfaces or the end 22c of the conductive pattern 22 may be formed by reflowing the second pattern 23'. Thus, according to an embodiment of the present invention, the conductive pattern 22 and the organic insulating layer 23 covering the edge region 22b and the lateral surfaces of the conductive pattern 22 may be formed using a single halftone mask. Thus, manufacturing costs may be reduced and a manufacturing process may be simplified, which may lead to a reduction in processing time.

The second pattern 23' may be formed from the photosensitive organic material layer 23'" including a photosensitive organic material having a solvent. When the second pattern 23' is heated to undergo a reflow process, the solvent within the photosensitive organic material may be removed and at substantially the same time the volume of the second pattern 23' may shrink. The second region 23b" of the first pattern 23" may be relatively thick and may receive a strong shrinkage force during the volume shrinkage. If the second pattern 23' includes substantially only the thick first portion 23b' without the thin second portion 23c', the second pattern 23' may be moved inwards due to the strong shrinkage force and might not cover the lateral surfaces of the conductive pattern 22 due to a surface tension of the reflowed second pattern 23'. When the second pattern 23' including substantially only the thick first portion 23b' is melted due to reflow, the melted second pattern 23' may break and at substantially the same time a void may be generated on the lateral surfaces of the conductive pattern 22.

According to an embodiment of the present invention, the second pattern 23' might not only include the thick first portion 23b' but may also include the thin second portion 23c' around the thick first portion 23b'. The thin second portion 23c' of the second pattern 23' may receive a weak shrinkage force compared with the thick first portion 23b' thereof. Furthermore, since the second portion 23c' may be relatively thin, the second portion 23c' may melt prior to the thick first portion 23b' due to reflow. Since a space below the thin second portion 23c' of the second pattern 23' may be empty, when a reflow process starts, the thin second portion 23c' may melt first and thus a portion of the thin second portion 23c' may flow along the lateral surfaces of the conductive pattern 22 or may cover the lateral surfaces of the conductive pattern 22 due to gravity. Consequently, according to an embodiment of the present invention, the lateral surfaces of the conductive pattern 22 may be completely covered due to the thin second portion 23c' of the second pattern 23'. Thus, a short-circuit between a conductive material layer formed by a different process and the lateral surfaces or the end 22c of the conductive pattern 22 may be prevented.

FIG. 3 is a cross-sectional view of an organic light-emitting display according to an embodiment of the present invention.

Referring to FIG. 3, an organic light-emitting display device 100 may include a substrate 110. A thin film transistor TFT may be disposed on the substrate 110. A via insulating layer 119 may cover the thin film transistor TFT. The organic light-emitting display device 100 may further include a pixel electrode 131 disposed on the via insulating layer 119 and electrically connected to the thin film transistor TFT. The pixel electrode 131 may include a center region on which an organic emission layer 132 may be disposed and an edge region around the center region. The organic light-emitting display device 100 may further include a pixel defining layer 140 exposing the center region of the pixel electrode 131 and covering the edge region of the pixel electrode 131. The organic emission layer 132 may be disposed on the center region of the pixel electrode 131. An opposite electrode 133 may be disposed on the organic emission layer 132 and the pixel defining layer 140. The pixel defining layer 140 may include an opening 140h in which the center region of the pixel electrode 131 may be exposed and may also include a first inclined portion 140a inclined toward the center region of the pixel electrode 131 and a second inclined portion 140b inclined in a different direction from the first inclined portion 140a. An end 131a of the pixel electrode 131 may be positioned between the via insulating layer 119 and the second inclined portion 140b.

The substrate 110 may include any of various materials, such as glass, plastic, and metal. According to an embodiment of the present invention, the substrate 110 may be flexible. The flexible substrate 110 may be referred to as a substrate that may be easily bent, folded, or rolled. The flexible substrate 110 may be formed of ultra-thin glass, metal, or plastic. For example, when the substrate 110 is formed of plastic, the substrate 110 may include polyimide (PI), but embodiments of the inventive concept are not limited thereto. A plurality of pixels may be arranged on the substrate 110 and an organic light-emitting device OLED for realizing an image may be disposed on each pixel.

A buffer layer 111 may be disposed on the substrate 110. The buffer layer 111 may prevent permeation of impure elements and may planarize the surface of the substrate 110. A barrier layer (not shown) may be interposed between the substrate 110 and the buffer layer 111.

The thin film transistor TFT may be disposed on the buffer layer 111. The thin film transistor TFT may function as a portion of a driving circuit unit for driving the organic light-emitting device °LED. The driving circuit unit may further include a capacitor, wiring and the like in addition to the thin film transistor TFT.

The thin film transistor TFT may include an active layer 121 disposed on the buffer layer 111, a gate electrode 122 of which at least a portion overlaps the active layer 121, a source electrode 123 electrically connected to a source region of the active layer 121 and a drain electrode 124 electrically connected to a drain region of the active layer 121. The drain electrode 124 may be electrically connected to the pixel electrode 131. A gate insulating layer 113 may be interposed between the active layer 121 and the gate electrode 122 and an interlayer insulating layer 115 may be interposed between the gate electrode 122 and the source electrode 123 and drain electrode 124.

The active layer 121 may include a semiconductor material, for example, amorphous silicon (a-Si) or polycrystalline silicon (poly-Si). However, embodiments of the inventive concept are not limited thereto. According to an embodiment of the present invention, the active layer 121 may include an organic semiconductor material or an oxide semiconductor material.

The gate electrode 122 may be electrically connected to a gate line that may apply an ON/OFF signal to the thin film transistor TFT and the gate electrode 122 may be formed of a low-resistance metal material. For example, the gate electrode 122 may be a single layer or multi-layer formed of a conductive material including molybdenum (Mo), aluminum (Al), copper (Cu), and/or titanium (Ti).

The source electrode 123 and drain electrode 124 may each include a single layer or multiple layers formed of a conductive material.

According to an embodiment of the present invention, the thin film transistor TFT may be of a top gate type in which the gate electrode 122 may be disposed on the active layer 121, but embodiments of the inventive concept are not limited thereto. According to an embodiment of the present invention, the thin film transistor TFT may be of a bottom gate type in which the gate electrode 122 may be disposed below the active layer 121.

The gate insulating layer 113 and the interlayer insulating layer 115 may be a single layer or multiple layers formed of an inorganic material. For example, the gate insulating layer 113 and the interlayer insulating layer 115 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and/or zirconium oxide ($ZrO_2$).

The via insulating layer 119 may cover the thin film transistor TFT and may have a planarized upper surface in order to mitigate a step difference caused by the thin film transistor TFT. The via insulating layer 119 may include a single layer or may include multiple layers formed of an organic material. However, embodiments of the inventive concept are not limited thereto. According to an embodiment of the present invention, the via insulating layer 119 may include an inorganic insulating layer or may include a stack of inorganic insulating layers and organic insulating layers.

The pixel electrode 131 electrically connected to the thin film transistor TFT through via holes VIA formed in the via insulating layer 119 may be disposed on the via insulating layer 119. According to an embodiment of the present invention, the pixel electrode 131 may be electrically connected to the drain electrode 124 of the thin film transistor TFT. However, embodiments of the inventive concept are not limited thereto.

The pixel electrode 131 may be formed of a material having a high work function. In bottom-emission type displays displaying an image in a direction of the substrate 110, the pixel electrode 131 may include at least one transparent conductive oxide selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

According to an embodiment of the present invention, in top-emission type displays displaying an image in a direction of the opposite electrode 133, the pixel electrode 131 may include at least one transparent conductive oxide selected from the group consisting of indium tin oxide (ITO), indium zinc oxide (IZO), zinc oxide (ZnO), indium oxide ($In_2O_3$), indium gallium oxide (IGO), and aluminum zinc oxide (AZO) and may further include at least one metal reflection layer selected from the group consisting of silver (Ag), magnesium (Mg), aluminum (Al), platinum (Pt), palladium (Pd), gold (Au), nickel (Ni), neodymium (Nd), iridium (Ir), and chromium (Cr).

The pixel defining layer 140 may include the opening 140h covering the edge region of the pixel electrode 131 and exposing the center region of the pixel electrode 131. The pixel defining layer 140 may further include the first inclined portion 140a inclined toward the center region of the pixel electrode 131 and the second inclined portion 140b inclined in a different direction from that of the first inclined portion 140a. The first inclined portion 140a may extend from a region P1 where an upper surface of the pixel electrode 131 contacts the opening 140h. The second inclined portion 140b may extend from the first inclined portion 140a toward a region P2 on an upper surface of the via insulating layer 119 in a different inclination direction than that of the first inclined portion 140a. The boundary between the first inclined portion 140a and the second inclined portion 140b may be defined as a region having a largest height in a vertical cross-section. For example, the boundary between the first inclined portion 140a and the second inclined portion 140b may be defined as a region having an upper surface parallel to the substrate 110.

An upper surface of the first inclined portion 140a may extend from the region P1, where the upper surface of the pixel electrode 131 may contact the opening 140h in a direction away from the substrate 110. For example, the first inclined portion 140a may have a cross-section of which a height increases from the region P1 to the boundary between the first inclined portion 140a and second inclined portion 140b. An upper surface of the second inclined portion 140b may extend from the first inclined portion 140a to the region P2 on the via insulating layer 119 in a direction toward the substrate 110. For example, the second inclined portion 23b may have a cross-section of which a height decreases from the boundary between the first inclined portion 140a and second inclined portion 140b to the region P2. The direction away from the substrate 110 and the direction toward the substrate 110, as used herein, do not mean only the direction exactly perpendicular to the upper surface of the substrate 110 and may also include directions approximately perpendicular to the upper surface of the substrate 110, including directions inclined at a predetermined angle with respect to the upper surface of the substrate 110.

The pixel defining layer 140 may expose an upper surface of the center region of the pixel electrode 131 and may cover the edge region of the pixel electrode 131 except for the center region thereof. The pixel defining layer 140 may include a photosensitive organic material, for example, polyimide (PI).

A portion of a lower surface of the organic insulating layer 140 may directly contact the upper surface of the pixel electrode 131 and the remaining portion thereof may directly contact the upper surface of the via insulating layer 119. The portion of the lower surface of the organic insulating layer 140 directly contacting the upper surface of the pixel electrode 131 may have a larger area than the remaining portion directly contacting the upper surface of the via insulating layer 119.

The edge region of the pixel electrode 131 may be interposed between the first inclined portion 140a of the pixel defining layer 140 and the via insulating layer 119. The edge region of the pixel electrode 131 may also be interposed between at least a portion of the second inclined portion 140b of the pixel defining layer 140 and the via insulating layer 119. For example, the end 131a of the pixel electrode 131 may be positioned between the via insulating layer 119 and the second inclined portion 140b. A distance d1 from the region P1 on the upper surface of the pixel electrode 131 to the end 131a of the pixel electrode 131 covered with the pixel defining layer 140 may be greater than a distance d2 from the region P2 on the upper surface of the via insulating layer 119 to the end 131a of the pixel electrode 131.

According to an embodiment of the present invention, a first angle $\theta 1$ between the upper surface of the pixel electrode 131 and the upper surface of the first inclined portion 140a may be greater than a second angle $\theta 2$ between the upper surface of the via insulating layer 119 and the upper surface of the second inclined portion 140b. For example, the first angle $\theta 1$ may be less than about 55° and the second angle $\theta 2$ may be less than about 35°. A difference between the first angle $\theta 1$ and the second angle $\theta 2$ may be about 5° or greater.

An angle of inclination of the upper surface of the first inclined portion 140a with respect to the upper surface of the pixel electrode 131 may vary according to locations on the first inclined portion 140a. An angle of inclination of the upper surface of the second inclined portion 140b with respect to the upper surface of the pixel electrode 131 may vary according to locations on the second inclined portion 140b. The first angle $\theta 1$ may denote an angle of inclination of the upper surface of the first inclined portion 140a at the region P1 on the upper surface of the pixel electrode 131 and the second angle $\theta 2$ may denote an angle of inclination of the upper surface of the second inclined portion 140b at the region P2 on the upper surface of the via insulating layer 119.

The organic emission layer 132 may be disposed on the center region of the pixel electrode 131. The center region of the pixel electrode 131 disposed on the upper surface of the organic emission layer 132 may be referred to as a light-emission region. The center region or the light-emission region of the pixel electrode 131 may be defined as a region of the pixel electrode 131 not covered with the pixel defining layer 140.

The organic emission layer 132 may include a low molecular organic material or a high molecular organic material. At least one of a hole injection layer (HIL), a hole transport layer (HTL), an electron transport layer (ETL), or an electron injection layer (EIL) in addition to the organic emission layer 132 may be further interposed between the pixel electrode 131 and the opposite electrode 133. According to an embodiment of the present invention, various functional layers other than the aforementioned layers may be further disposed between the pixel electrode 131 and the opposite electrode 131.

The organic emission layer 132 may be disposed in substantially each organic light-emitting device OLED and the organic light-emitting device OLED may emit light of a red, green or blue color according to the type of organic emission layer 132 included in the organic light-emitting device OLED. However, embodiments of the inventive concept are not limited thereto and a plurality of organic emission layers 132 may be disposed on a single organic light-emitting device OLED. For example, organic emission layers 132 respectively emitting light of at least two primary colors of red, green, and blue may be stacked or mixed vertically to emit white color light. The organic light-emitting display 100 may further include a color converting layer or a color filter that may covert the white light into a light of a predetermined color. The red, green, and blue primary colors are exemplary and thus a color combination for emitting white light is not limited thereto.

The opposite electrode 133 may be disposed on the organic emission layer 132 and may be formed of various conductive materials. For example, the opposite electrode 133 may include a single layer or may include multiple layers including at least one of lithium (Li), calcium (Ca), lithium fluoride (LiF), aluminum (Al), magnesium (Mg), or silver (Ag). In bottom-emission type displays, the opposite electrode 133 may be a reflective electrode. In top-emission type displays, the opposite electrode 133 may be a transparent electrode or semitransparent electrode.

According to an embodiment of the present invention, a thin layer encapsulation layer 150 including at least one organic layer 151 and at least one inorganic layer 152 may be disposed on the opposite electrode 133 and may encapsulate the organic light-emitting device OLED. The thin-film encapsulation layer 150 may encapsulate the organic light-emitting device OLED and may prevent the organic light-emitting device OLED from being exposed to external air or foreign materials. Since the thin-film encapsulation layer 150 may be relatively thin, the thin-film encapsulation layer 150 may be used as an encapsulating means for flexible displays that may be bendable or foldable.

According to an embodiment of the present invention, the inorganic layer 152 may include oxide, nitride, or oxynitride, such as silicon nitride (SiNx), silicon oxide ($SiO_2$) or silicon oxynitride (SiOxNy). The inorganic layer 152 may block or reduce permeation of foreign materials, such as moisture or oxygen, to the organic light-emitting device OLED. The inorganic layer 152 may directly contact the upper surface of the edge region of the substrate 110. An edge region of the inorganic layer 152 may contact the upper surface of the substrate 110 and detachment of the inorganic layer 152 from the interlayer insulating layer 115 may be reduced or prevented, which may lead to the thin layer encapsulation layer 150 being more effective.

The organic layer 151 of the thin layer encapsulation layer 150 may be disposed between the opposite electrode 133 and the inorganic layer 152 and may block or reduce permeation of foreign materials, such as moisture or oxygen, into the organic light-emitting device OLED. The organic layer 151 may be used together with the inorganic layer 152 to increase a level of protection from foreign materials and may planarize an unsmooth surface. According to an embodiment of the present invention, the organic layer 151 may include any of various organic materials, such as epoxy-based resin, acryl-based resin, or polyimide-based resin.

According to an embodiment of the present invention, a functional layer (not shown) and a protection layer may be further disposed between the opposite electrode 133 and the thin layer encapsulation layer 150. The functional layer may include a capping layer and/or an LiF layer for increasing luminescent efficiency by controlling the refractive index of visible light emitted from the organic light-emitting device OLED. The protection layer may include an inorganic material, such as aluminum oxide ($Al_2O_3$).

FIGS. 4A to 4G are cross-sectional views illustrating a method of manufacturing an organic light-emitting display of FIG. 3 according to an embodiment of the present invention.

Figure 4A:
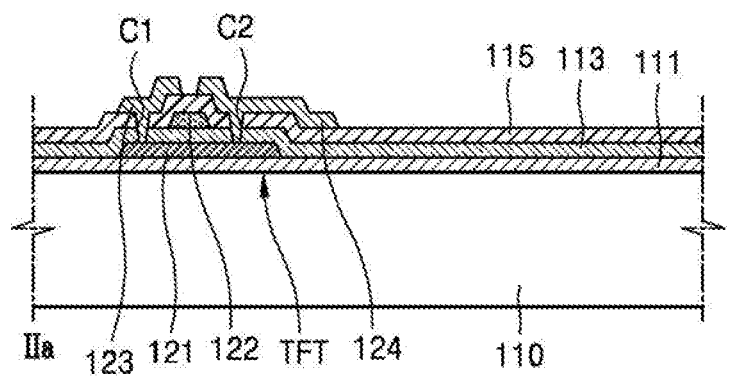
FIGS. 4A to 4G are cross-sectional views illustrating a method of manufacturing an organic light-emitting display of FIG. 3 according to an exemplary embodiment of the present invention.

Referring to FIG. 4A, the thin film transistor TFT may be formed on the substrate 110.

The buffer layer 111 may be formed on the substrate 110. A semiconductor material layer may be formed on the buffer layer 111 and the semiconductor material layer may then be patterned to thereby form the active layer 121. The gate insulating layer 113 may be formed on the active layer 121. A conductive material layer may be formed on the gate insulating layer 113 and patterned to thereby form the gate electrode 122. At least a portion of the gate electrode 122 may overlap the active layer 121.

The interlayer insulation layer 115 may be formed to cover the gate electrode 122. The interlayer insulating layer 115 and the gate insulating layer 113 may be substantially simultaneously etched to thereby form a first contact hole C1 via and a second contact hole C2 via in which some regions of the active layer 121 are exposed. According to an embodiment of the present invention, the active layer 121 may include polycrystalline silicon (poly-Si) and the regions of the active layer 121 exposed by the first contact hole C1 and second contact hole C2 may be the source region and the drain region of the active layer 121, respectively.

A conductive material layer may be formed on the interlayer insulating layer 115 and patterned to thereby form the source electrode 123 and the drain electrode 124 that may be respectively electrically connected to the source region and the drain region of the active layer 121.

Figure 4B:
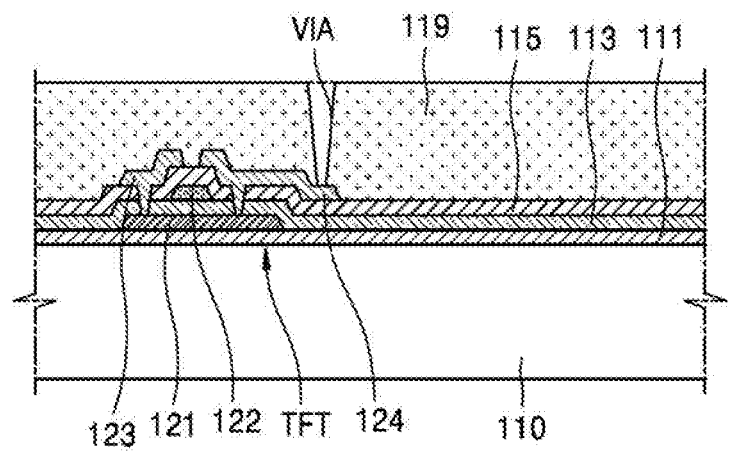

Referring to FIG. 4B, a first insulating material layer may cover the thin film transistor TFT, The first insulating layer may be formed on the substrate 110 and patterned to thereby form the via insulating layer 119. The via insulating layer may include the via holes VIA through which portions of the drain electrode 124 of the thin film transistor TFT may be exposed. The via insulating layer 119 may include a single layer or may be multiple layers formed of an organic material.

Figure 4C:
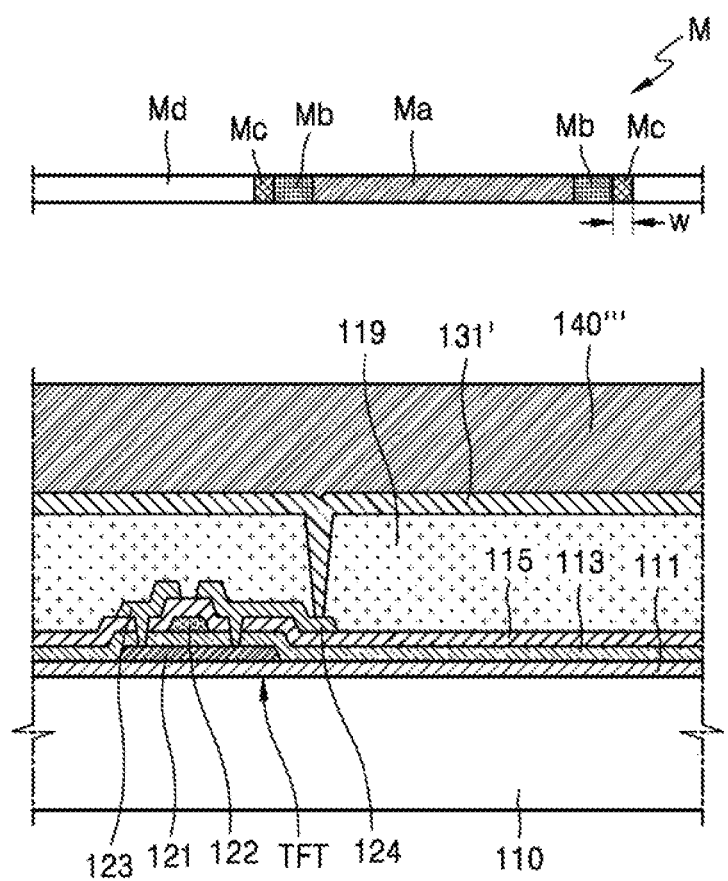

Referring to FIG. 4C, a conductive material layer 131' and a second insulating material layer 140''' may be sequentially formed on the via insulating layer 119. The conductive material layer 131' may include at least one transparent conductive oxide selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The conductive material layer 131' may further include a metal reflective layer, such as silver (Ag), magnesium (Mg), aluminum (Al), platinum (Pt), palladium (Pd), gold (Au), nickel (Ni), neodymium (Nd), iridium (Ir), or chromium (Cr).

The second insulating material layer 140'' may include a photosensitive organic material that is insulating and may be referred to as a photosensitive organic material layer. The photosensitive organic material may be a positive photosensitive material of which a portion exposed to light may be removed. The photosensitive organic material may alternatively be a negative photosensitive material of which a portion not exposed to light may be removed. The photosensitive organic material may include a solvent to enable the photosensitive organic material to be reflowed by applying, for example, heat or infrared rays thereto. The photosensitive organic material may include, for example, an olefin-based organic material, an acryl-based organic material, or an imide-based organic material. For example, the photosensitive organic material may include polyimide (PI).

Light may be radiated to the second insulating material layer 140''' and a halftone mask M may be used to block and transmit light according to a desired pattern. The halftone mask M may include a first mask region Ma, a second mask region Mb, a third mask region Md, and a fourth mask region Mc. The first mask region Ma may correspond to the light-emission region of the pixel electrode 131 of FIG. 3. The second mask region Mb may have an outer boundary that surrounds the first mask region Ma and corresponds to an edge of the pixel electrode 131. The third mask region Md may correspond to a region of the via insulating layer 119 of FIG. 3 from which the conductive material layer 131' may be removed, for example, a region of the via insulating layer 119 on which the pixel electrode 131 might not be disposed. The fourth mask region Mc may be disposed between the second mask region Mb and the third mask region Md.

The fourth mask region Mc may be disposed along the output boundary of the second mask region Mb to surround the second mask region Mb. The output boundary of the second mask region Mb may be defined as a boundary between the second mask region Mb and the fourth mask region Mc.

According to an embodiment of the present invention, when the second insulating material layer 140''' includes a positive photosensitive material, the first mask region Ma may transmit a portion of light, the second mask region Mb may block substantially all light, the third mask region Md may transmit substantially all light, and the fourth mask region Mc may transmit a portion of light. Therefore, the light transmittance of the first mask region Ma may be higher than the light transmittance of the fourth mask region Mc.

According to an embodiment of the present invention, when the second insulating material layer 140''' includes a negative photosensitive material, the first mask region Ma may transmit a portion of light, the second mask region Mb may transmit substantially all light, the third mask region Md may block substantially all light, and the fourth mask region Mc may transmit a portion of light. Therefore, the light transmittance of the fourth mask region Mc may be higher than the light transmittance of the first mask region Ma.

Figure 4D:
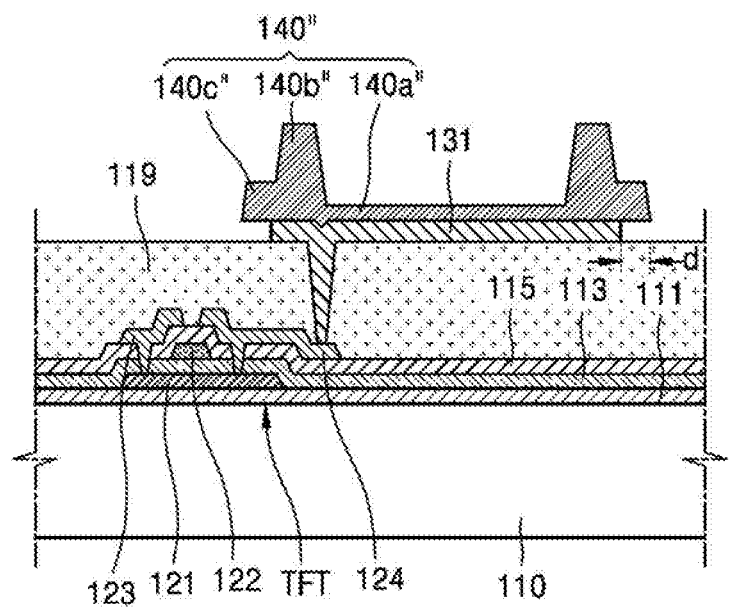

Referring to FIGS. 4C and 4D, a portion of the second insulating material layer 140''' irradiated with light through the halftone mask M may be removed. The second insulating material layer 140''' may undergo a developing process prior to removal. Portions of the second insulating material layer 140''' respectively corresponding to the first and fourth mask regions Ma and Mc may be partially removed and a portion of the second insulating material layer 140''' corresponding to the third mask region Md may be substantially completely removed.

As a portion of the second insulating material layer 140''' is removed, a first insulating pattern 140'' including a first region 140a'', a second region 140b'', and a third region 140c'' may be formed. The first insulating pattern 140'' may be referred to as a first pattern.

The second region 140b'' may correspond to the second mask region Mb and a portion of the second insulating material layer 140''' corresponding to the second mask region Mb may be relatively thick since the portion corresponding to the second mask region Mb might not be substantially removed. The first region 140a'' may correspond to the first mask region Ma and a portion of the second insulating material layer 140''' corresponding to the first mask region Ma may be thinner than the second region 140b'' since the portion corresponding to the first mask region Ma may be partially removed. The third region 140c'' may correspond to the fourth mask region Mc and a portion of the second insulating material layer 140''' corresponding to the fourth mask region Mc may be thinner than the second region 140b'' since the portion corresponding to the fourth mask region may be partially removed.

When the second insulating material layer 140''' includes a positive photosensitive material, the light transmittance of the first mask region Ma may be higher than the light transmittance of the fourth mask region Mc. When the second insulating material layer 140''' includes a negative photosensitive material, the light transmittance of the fourth mask region Mc may be higher than the light transmittance of the first mask region Ma. Accordingly, more of the portion of the second insulating material layer 140''' corresponding to the first mask region Ma may be removed than the portion of the second insulating material layer 140''' corresponding to the fourth mask region Mc. Consequently, more of the portion of the second insulating material layer 140''' corresponding to the fourth mask region Mc may remain than the portion of the second insulating material layer 140''' corresponding to the first mask region Ma and the third region 140c'' may be thicker than the first region 140a''. As such, an average thickness of the first region 140a'' may be lower than an average thickness of the third region 140c''.

The pixel electrode 131 may be formed by wet etching the conductive material layer 131' by using the first insulating pattern 140'' as a hard mask. The pixel electrode 131 may be disposed below the first insulating pattern 140'' and lateral surfaces of the pixel electrode 131 may be exposed.

The conductive material layer 131' may be etched using the first insulating pattern 140'' as a hard mask. Accordingly, the lower surface of a portion of the third region 140c'' of the first insulating pattern 140'' may be exposed. The portion of the third region 140c'' having the lower surface exposed may be positioned on a void. For example, the edge of the pixel electrode 131 may be indented from an edge of the first insulating pattern 140'' by a distance d. The distance d may be about 0.7 μm or greater. The distance d may be about 2 μm or less.

Figure 4E:
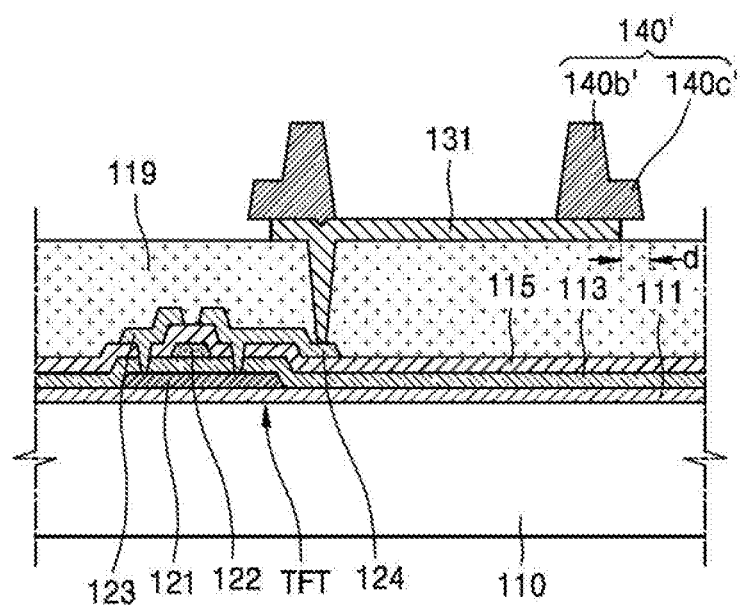

Referring to FIGS. 4D and 4E, a portion of the first insulating pattern 140'' may be removed such that the upper surface of the light-emission region of the pixel electrode 131 is exposed. For example, the first insulating pattern 140'' may undergo an ashing process and thus the thickness of the first insulating pattern 140'' may decrease. For example, through the ashing process, the first region 140a'' of the first insulating pattern 140'' may be completely removed and thus the upper surface of the light-emission region of the pixel electrode 131 covered with the first region 140a'' may be exposed. When the first region 140a'' of the first insulating pattern 140'' is removed, the second region 140b'' and the third region 140c'' of the first insulating pattern 140'' may also be removed. However, since the second region 140b'' and the third region 140c'' may be thicker than the first region 140a'', the second region 140b'' and the third region 140c'' might not be completely removed.

Consequently, the second insulating pattern 140' may be formed to expose the upper surface of the light-emission region of the pixel electrode 131. The second insulating pattern 140' may be referred to as a second pattern. A first portion 140b' of the second insulating pattern 140' may correspond to a portion that may remain after the second region 140b'' of the second region 140b'' of the first insulating pattern 140'' is partially removed. A second portion 140c' of the second insulating pattern 140' may correspond to a portion that may remain after the third region 140c'' of the third region 140c'' of the first insulating pattern 140'' is partially removed. The second insulating pattern 140' may cover an edge region of the pixel electrode 131 and may expose the lateral surfaces of the pixel electrode 131.

Figure 4F:
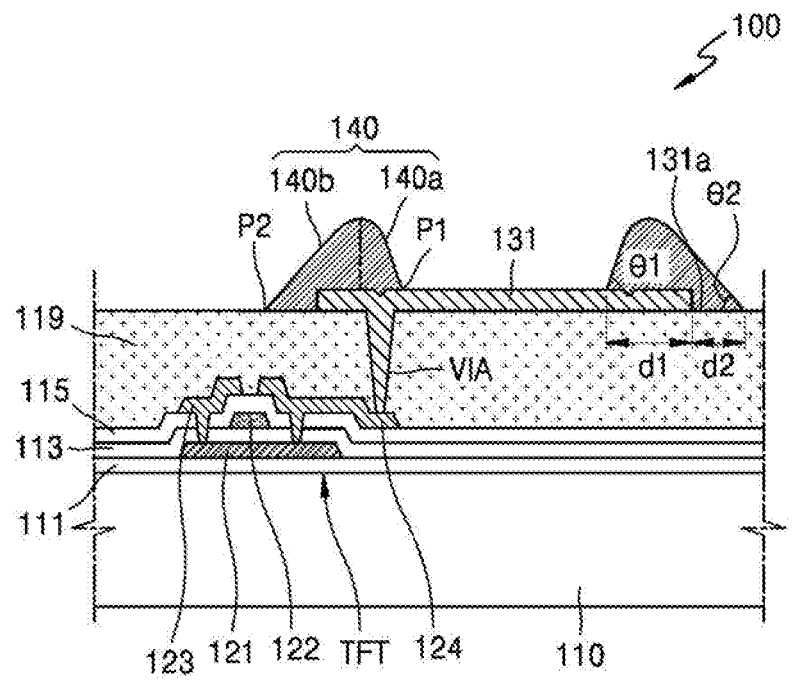

Referring to FIGS. 4E and 4F, the pixel defining layer 140 covering the lateral surfaces or the end 131a of the pixel electrode 131 may be formed by reflowing the second insulating pattern 140'. The pixel defining layer 140 may expose the light-emission region of the pixel electrode 131 and cover the edge region and the lateral surfaces of the pixel electrode 131.

The second insulating pattern 140' may be thermally reflowed by applying, for example, heat or infrared rays. To perform a reflow process, the substrate 110 including the second insulating pattern 140' may be disposed on a hot plate. Since the hot plate delivers heat upwards from the substrate 110, the second portion 140c' of the second insulating pattern 140' may flow along the lateral surfaces of the conductive pattern 131. The reflow process may also be performed by heating the substrate 110 including the second insulating pattern 140' within an oven or irradiating the substrate 110 including the second insulating pattern 140' with infrared rays.

Figure 4G:
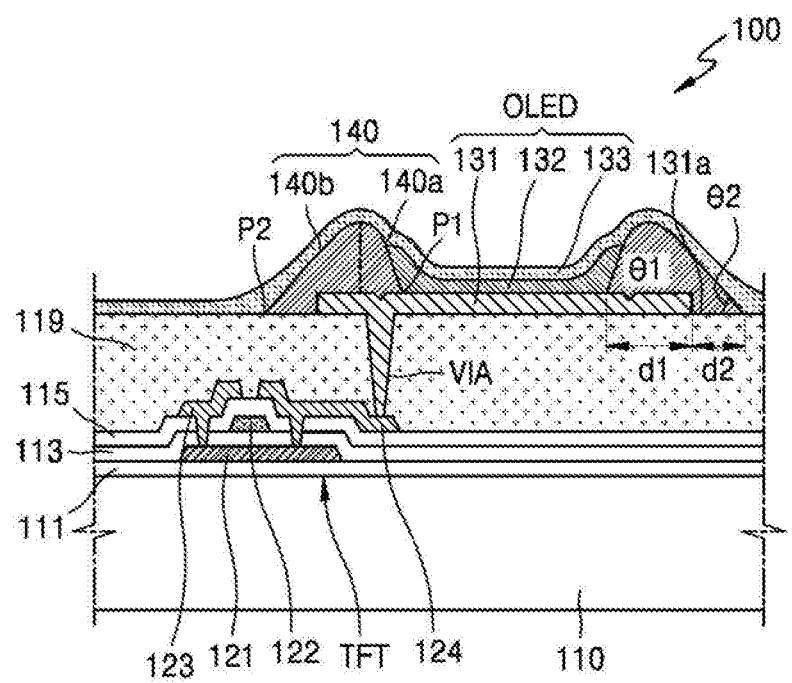

When the end 131a of the pixel electrode 131 is exposed, a short circuit may occur between the pixel electrode 131 and the opposite electrode 133 of FIG. 4G formed by a different process. According to an embodiment of the present invention, the pixel defining layer 140 covering the end 131a of the pixel electrode 131 may be formed by reflowing the second insulating pattern 140. Thus, according to a method of manufacturing an organic light-emitting display 100 according to an embodiment of the present invention, the pixel electrode 131 and the pixel defining layer 140 covering the edge region and the lateral surfaces of the pixel electrode 131 may be formed using a single mask. Thus, manufacturing costs may be reduced and a manufacturing process may be simplified, which may lead to a reduction in processing time.

Referring to FIG. 4G, the organic light-emission layer 132 may be formed on the light-emission region of the pixel electrode 131. The light emission region may be a region of the pixel electrode 131 not covered with the pixel defining layer 140.

The opposite electrode 133 may be formed on the organic light-emission layer 132 and the pixel defining layer 140. The opposite electrode 133 may also be formed on an exposed region of the via insulating layer 119, which may be a region of the via insulating layer 119 not covered with the pixel electrode 131 and the pixel defining layer 140. The thin-film encapsulation layer 150 of FIG. 3 including at least one organic layer 151 and at least one inorganic layer 152 may be formed on the opposite electrode 133.

Figure 5A:
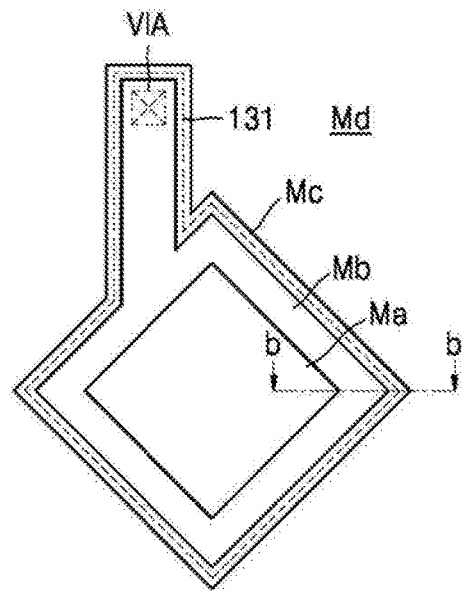
FIG. 5A is a plan view illustrating a halftone mask used to manufacture an organic light-emitting display according to an exemplary embodiment of the present invention.
Figure 5B:
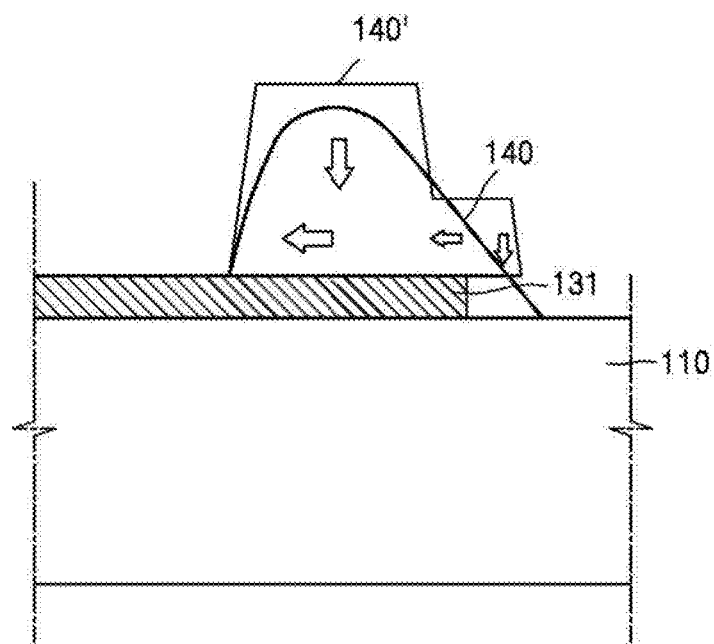
FIG. 5B is a magnified cross-sectional view illustrating a pixel electrode according to an exemplary embodiment of the present invention.

FIG. 5A is a plan view illustrating a halftone mask that may be used to manufacture an organic light-emitting display according to an embodiment of the present invention. FIG. 5B is a magnified cross-sectional view illustrating a pixel electrode according to an embodiment of the present invention.

Referring to FIG. 5A, the halftone mask M for forming the pixel electrode 131 of FIG. 3 and the pixel defining layer 140 of FIG. 3 is illustrated. The pixel electrode 131 may be electrically connected to the thin film transistor TFT through the via holes VIA formed in the via insulating layer 119 of FIG. 3.

The halftone mask M may include a first mask region Ma, a second mask region Mb, a third mask region Md, and a fourth mask region Mc. The first mask region Ma may correspond to the light-emission region of the pixel electrode 131. The second mask region Mb may have an outer boundary that surrounds the first mask region Ma and corresponds to an edge of the pixel electrode 131. The third mask region Md may correspond to a region of the via insulating layer 119 of FIG. 3 from which the conductive material layer 131' may be removed, for example, a region of the via insulating layer 119 on which the pixel electrode 131 is not disposed. The fourth mask region Mc may be disposed between the second and third mask regions Mb and Md along the output boundary of the second mask region Mb to surround the second mask region Mb.

The edge of the pixel electrode 131 may overlap the third mask region Md. Since the pixel electrode 131 may be formed by etching, the edge of the pixel electrode 131 may be indented a certain distance from the outer boundary of the third mask region Md.

Referring to FIG. 5B, the second insulating pattern 140' and the pixel defining layer 140 on the pixel electrode 131 may overlap with each other.

After light is radiated to the second insulating material layer 140' of FIG. 4C by using the halftone mask M, a portion of the second insulating material layer 140'" of FIG. 4C may be removed, and thus the first insulating pattern 140" of FIG. 4D may be formed. When the first insulating pattern 140" of FIG. 4D undergoes ashing, the second insulating pattern 140' may be formed. When the second insulating pattern 140 is reflowed, the pixel defining layer 140 may be formed.

The second insulating pattern 140' may be formed from the second insulating material layer 140'" including a photosensitive organic material having a solvent. When the second insulating pattern 140' is reflowed by having heat or infrared rays applied thereto, the solvent within the photosensitive organic material may be removed and at substantially the same time the volume of the second insulating pattern 140' may shrink. Referring to FIG. 5A, the second insulating pattern 140' may have a donut shape and an inner diameter of the second insulating pattern 140' may decrease during the volume shrinkage.

A thick portion of the second insulating pattern 140' may receive a strong shrinkage force during the volume shrinkage. If the second insulating pattern 140' includes substantially only a thick portion without having a thin portion, the second insulating pattern 140' may be moved inwards due to the strong shrinkage force and might not cover the lateral surfaces of the pixel electrode 131 due to a surface tension of the reflowed second insulating pattern 140'. When the second insulating pattern 140' including substantially only a thick portion is melted due to reflow, the melted second insulating pattern 140' may break and at substantially the same time a void may be generated on the lateral surfaces of the pixel electrode 131.

According to an embodiment of the present invention, as shown in FIG. 5B, the second insulating pattern 140' may include a thick portion and a thin portion positioned outside the thick portion. A thin portion of the second insulating pattern 140' may receive a weaker shrinkage force than the thick portion thereof. Moreover, since the thin portion of the second insulating pattern 140' may be relatively thin, the thin portion may melt prior to the thick portion due to reflow. Since a space adjacent to the thin portion of the second insulating pattern 140' may be empty, when a reflow process starts, the thin portion of the second insulating pattern 140' may flow along the lateral surfaces of the pixel electrode 131 or may cover the lateral surfaces of the pixel electrode 131 due to gravity. Consequently, according to an embodiment of the present invention, the lateral surfaces of the pixel electrode 131 may be completely covered due to the thin portion of the second insulating pattern 140'. Thus, a short-circuit between the opposite electrode 133 of FIG. 3 formed by a different process and the lateral surfaces or the end 131a of the pixel electrode 131 may be prevented.

While one or more embodiments of the present invention have been described with reference to the figures, it will be understood by those of ordinary skill in the art that various changes in form and details may be made therein without departing from the spirit and scope of the instant disclosure.

What is claimed is:

1. A method of forming a conductive pattern comprising:
   forming a conductive material layer for forming the conductive pattern on a substrate;
   forming a photosensitive organic material layer on the conductive material layer;
   irradiating the photosensitive organic material layer through a halftone mask including a first mask region having a boundary corresponding to an edge of the conductive pattern, a second mask region, and a third mask region disposed between the first mask region and the second mask region;

forming a first pattern including a first region corresponding to the first mask region and having a first thickness and a second region corresponding to the third mask region and having a second thickness smaller than the first thickness by removing the photosensitive organic material layer;

etching the conductive material layer using the first pattern as a hard mask and forming the conductive pattern arranged below the first pattern and having exposed lateral surfaces; and forming a second pattern that covers the lateral surfaces of the conductive pattern by reflowing the first pattern.

2. The method of claim 1, wherein the third mask region is disposed along the boundary of the first mask region and surrounds the first mask region.

3. The method of claim 1, wherein the etching of the conductive material layer comprises exposing a portion of a lower surface of the second region of the first pattern.

4. The method of claim 3, wherein the edge of the conductive pattern is indented with respect to an edge of the first pattern.

5. The method of claim 1, wherein the removing of the photosensitive organic material layer comprises fully removing a first portion of the photosensitive organic material layer corresponding to the second mask region and partially removing a second portion of the photosensitive organic material layer corresponding to the third mask region.

6. The method of claim 1, wherein the forming of the second pattern comprises covering the lateral surfaces of the conductive pattern by flowing a portion of the first pattern to along the lateral surfaces of the conductive pattern.

7. The method of claim 1, wherein the conductive pattern has an exposed region of which an upper surface is not covered with the second pattern;

the halftone mask further comprises a fourth mask region corresponding to the exposed region of the conductive pattern inside the first mask region; and the first pattern further comprises a third region having a third thickness smaller than the first thickness, in correspondence with the fourth mask region, inside the first region.

8. The method of claim 7, wherein an average thickness of the third region is less than an average thickness of the second region.

9. The method of claim 7, further comprising ashing the first pattern such that an upper surface of the exposed region of the conductive pattern is exposed.

10. A method of manufacturing a display device comprising:

forming a thin film transistor on a substrate;

forming a via insulating layer covering the thin film transistor;

forming a conductive material layer for forming a pixel electrode on the via insulating layer;

forming a photosensitive organic material layer on the conductive material layer;

irradiating the photosensitive organic material layer through a halftone mask including a first mask region corresponding to a light-emission region of the pixel electrode, a second mask region surrounding the first mask region and having an outer boundary corresponding to an edge of the pixel electrode, a third mask region, and a fourth mask region disposed between the second mask region and the third mask region;

removing the photosensitive organic material layer to form a first pattern including a first region corresponding to the first mask region and having a first thickness, a second region having a second thickness greater than the first thickness, and a third region corresponding to the fourth mask region and having a third thickness smaller than the second thickness;

etching the conductive material layer using the first pattern as a hard mask to form the pixel electrode arranged below the first pattern and having exposed lateral surfaces;

removing a portion of the first pattern to form a second pattern through which an upper surface of the light-emission region of the pixel electrode is exposed; and reflowing the second pattern to form a pixel defining layer exposing the light-emission region of the pixel electrode and covering the lateral surfaces of the pixel electrode.

11. The method of claim 10, wherein the fourth mask region is disposed along the outer boundary of the second mask region to surround the second mask region.

12. The method of claim 10, wherein the etching of the conductive material layer comprises exposing a portion of a lower surface of the third region of the first pattern.

13. The method of claim 12, wherein the edge of the pixel electrode is indented with respect to an edge of the first pattern.

14. The method of claim 10, wherein an average thickness of the first region is less than an average thickness of the third region.

15. The method of claim 10, wherein the removing of the photosensitive organic material layer comprises partially removing regions of the photosensitive organic material layer corresponding to the first and fourth mask regions and fully removing a region of the photosensitive organic material layer corresponding to the third mask region.

16. The method of claim 10, wherein the forming of the second pattern comprises ashing the first pattern so that the third region is removed.

17. The method of claim 10, wherein the reflowing of the second pattern comprises covering lateral surfaces of the pixel electrode by flowing a portion of the second pattern along the lateral surfaces of the pixel electrode.

18. The method of claim 10, further comprising:

forming an organic emission layer on the light-emission region of the pixel electrode; and forming an opposite electrode on the organic emission layer and the pixel defining layer.

19. The method of claim 18, further comprising forming a thin-film encapsulation layer comprising at least one inorganic layer and at least one organic layer on the opposite electrode.

20. A method of manufacturing a display device comprising:

forming a thin film transistor on a substrate;

forming a via insulating layer covering the thin film transistor;

forming a conductive material layer for forming a pixel electrode having a center region on the via insulating layer;

forming a photosensitive organic material layer on the conductive material layer;

irradiating the photosensitive organic material layer through a halftone mask;

removing the photosensitive organic material layer to form a first pattern including a first region having a first thickness, a second region having a second thickness greater than the first thickness, and a third region having a third thickness smaller than the second thickness;

etching the conductive material layer using the first pattern as a hard mask to form the pixel electrode arranged adjacent to the first pattern;

removing a portion of the first pattern to form a second pattern through which an upper surface of the center region of the pixel electrode is exposed; and reflowing the second pattern to form a pixel defining layer exposing an upper surface of the center region of the pixel electrode and covering lateral surfaces of the pixel electrode, wherein the reflowing of the second pattern comprises covering the lateral surfaces of the pixel electrode by flowing a portion of the second pattern along the lateral surfaces of the pixel electrode.

\* \* \* \* \*